(12) United States Patent
Xue et al.

(10) Patent No.: US 9,196,534 B2
(45) Date of Patent: Nov. 24, 2015

(54) METHOD FOR PREPARING SEMICONDUCTOR DEVICES APPLIED IN FLIP CHIP TECHNOLOGY

(71) Applicant: Alpha and Omega Semiconductor Incorporated, Sunnyvale, CA (US)

(72) Inventors: Yan Xun Xue, Los Gatos, CA (US); Ping Huang, Shanghai (CN); Hamza Yilmaz, Saratoga, CA (US); Yueh-Se Ho, Sunnyvale, CA (US); Lei Shi, Shanghai (CN); Liang Zhao, Shanghai (CN); Ping Li Wu, Shanghai (CN); Lei Duan, Shanghai (CN); Yuping Gong, Shanghai (CN)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 72 days.

(21) Appl. No.: 13/775,212

(22) Filed: Feb. 24, 2013

(65) Prior Publication Data

US 2014/0242756 A1    Aug. 28, 2014

(51) Int. Cl.
| | |
|---|---|
| *H01L 21/02* | (2006.01) |
| *H01L 21/78* | (2006.01) |
| *H01L 23/00* | (2006.01) |
| *H01L 23/31* | (2006.01) |
| *H01L 21/56* | (2006.01) |

(52) U.S. Cl.
CPC ............. *H01L 21/78* (2013.01); *H01L 21/561* (2013.01); *H01L 23/3114* (2013.01); *H01L 24/11* (2013.01); *H01L 24/13* (2013.01); *H01L 24/73* (2013.01); *H01L 2224/1184* (2013.01); *H01L 2224/13101* (2013.01); *H01L 2224/13111* (2013.01); *H01L 2224/13147* (2013.01); *H01L 2224/29* (2013.01); *H01L 2224/2919* (2013.01); *H01L 2224/73104* (2013.01); *H01L 2224/83191* (2013.01); *H01L 2924/10156* (2013.01); *H01L 2924/10157* (2013.01); *H01L 2924/13091* (2013.01); *H01L 2924/18301* (2013.01)

(58) Field of Classification Search
USPC ........................................................ 438/576
See application file for complete search history.

(56) References Cited

U.S. PATENT DOCUMENTS

| | | | |
|---|---|---|---|
| 8,778,735 B1 * | 7/2014 | Xue et al. ...................... 438/114 |
| 2006/0275949 A1 * | 12/2006 | Farnworth et al. ............ 438/106 |
| 2008/0242052 A1 * | 10/2008 | Feng et al. ..................... 438/459 |
| 2010/0009519 A1 * | 1/2010 | Seddon et al. ................. 438/464 |

* cited by examiner

*Primary Examiner* — Charles Garber
*Assistant Examiner* — Stanetta Isaac

(57) ABSTRACT

A method for preparing semiconductor devices in a flip chip process comprises forming deep grooves surrounding each of the semiconductor chips; depositing a first plastic package material to form a first plastic package layer covering front surface of the semiconductor wafer and filling the deep grooves; depositing a metal layer at back surface of the semiconductor wafer after grinding; grinding an outermost portion of the metal layer thus forming a ring area located at back surface around edge of the semiconductor wafer not covered by the metal layer; cutting the first plastic package layer, the semiconductor wafer, the metal layer and the first plastic package material filled in the deep grooves along a straight line formed by two ends of each of the deep grooves filled with the first plastic package material; and picking up the semiconductor devices and mounting on a substrate without flipping the semiconductor devices.

16 Claims, 11 Drawing Sheets

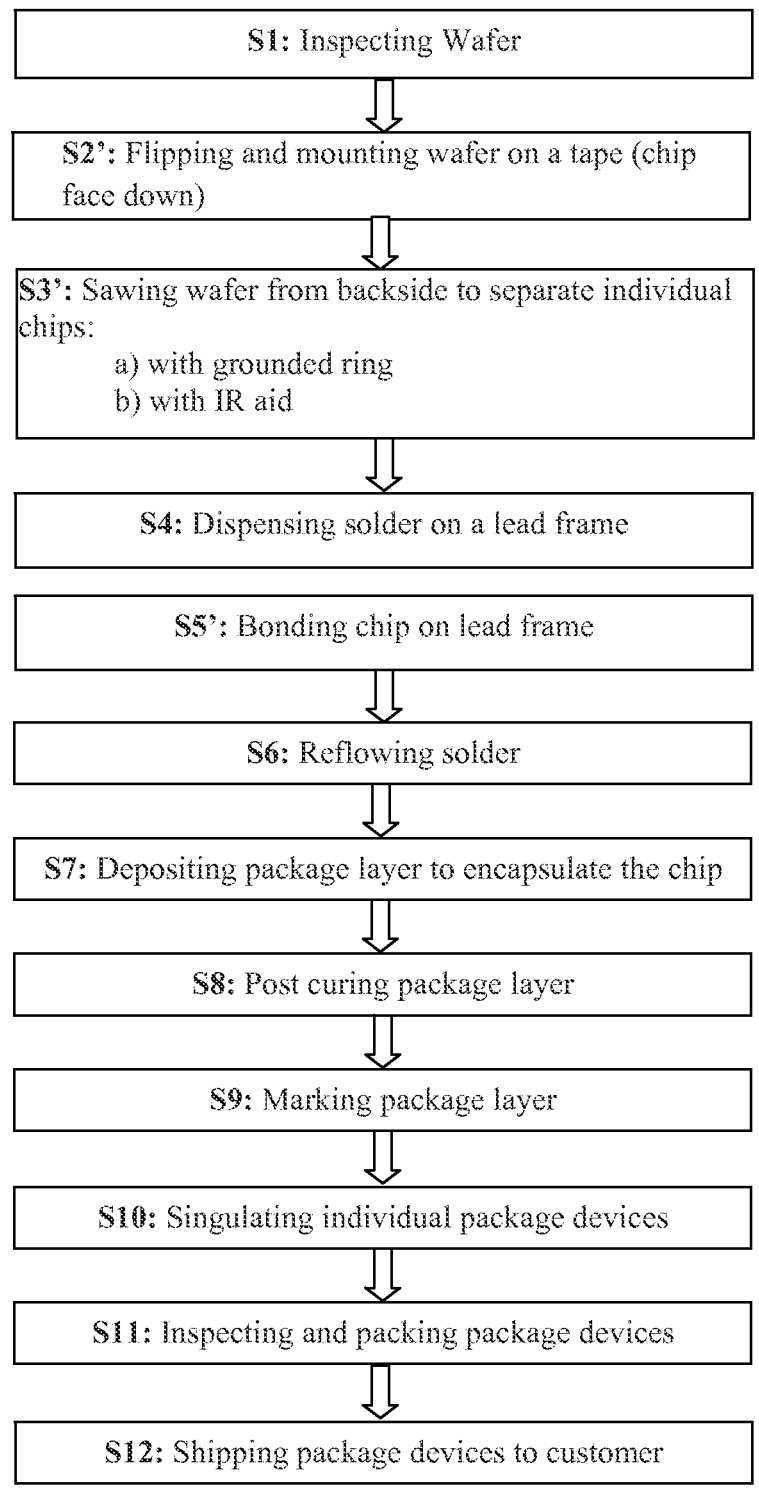
FIG. 1B (Present Invention)

US 9,196,534 B2

METHOD FOR PREPARING SEMICONDUCTOR DEVICES APPLIED IN FLIP CHIP TECHNOLOGY

FIELD OF THE INVENTION

The invention relates to a preparation method of semiconductor devices, in particular, the invention relates to a method for preparing semiconductor devices applied in flip chip technology at a wafer level.

DESCRIPTION OF THE RELATED ART

Flip chip technology is widely applied in the semiconductor packaging process in which a semiconductor chip with metal bumps is flipped and mounted on a substrate such as a die paddle or a circuit board, and the like. The semiconductor chip is flipped and mounted by a special equipment in two steps: first, a semiconductor chip (or a complete packaged device) is picked up from the wafer and flipped with a handler, then the flipped chip is transferred to another handler and attached on the substrate with electrical and mechanical connections. An obvious problem of the existing method is that the process is complicated to operate and the production efficiency, or Unit Per Hour (UPH), is extremely low.

In conventional wafer level packaging technology, the front surface of the semiconductor wafer needs to be encapsulated by a plastic package material to improve the physical strength of the semiconductor wafer, thus, the scribe lines at the front of the semiconductor wafer are also covered by the plastic package material, therefore the traditional cutting steps to separate individual semiconductor devices would be inapplicable.

U.S. Pat. No. 6,107,164 proposes a method for dicing an encapsulated semiconductor wafer. In this method, grooves are formed along the scribe lines between semiconductor chips at the front of the wafer and a plastic package layer is applied to cover the front surface of the wafer and to fill the grooves. The back of the wafer is then grounded to expose grooves from the back. Finally, the wafer is divided into pieces at the exposed groove portions. However, in this method, the groove must be deep enough or the wafer must be ground thin enough to expose the groove, which is obviously not very practical to apply in the actual production. On the other hand, during the process of making the semiconductor chips from the wafer, the back side of the wafer is ground, etched, and then ion injection and metallization are carried out. The etching step is essential to eliminate lattice damage at the back side of the wafer due to grinding. As a result, the back side of the wafer is easy to corrode during the etching step.

FIG. 1A is a process flow for making a semiconductor device of the prior art. In steps S1-S2, after the semiconductor wafer passed the inspection, the wafer is attached to an adhesive film with the front side of the wafer facing upward, then the wafer is cut, as shown in step S3, to separate individual chips from the wafer. On the other hand, a bonding material (such as a solder) is deposited to coat on a substrate (such as lead-frame/substrate and the like) as shown in step S4. Thus, the individual chips are picked up from the adhesive film and flipped by a special flip chip device and then attached on the substrate through the bonding material as shown in step S5, as such the electrode/contact terminal at the front surface of the chip faces downward and is electrically and mechanically connected to the contact area (such as, the metal area or pad) on the substrate. A reflow soldering is carried out as shown in step S6. A plastic package material is deposited to encapsulate each semiconductor chip as shown in step S7 following by the post curing the plastic package layer under high temperature as shown in step S8. The plastic package layer is then marked with, for example product lot, part name, manufacturer logos, etc, as shown in Step S9. As shown in step S10, the substrate and the plastic package layer are cut through to separate the individual package device containing the semiconductor chip. As shown in steps S11-S12, the package device is inspected, packed and finally shipped out to customer.

As mentioned above, the method of FIG. 1 is complicated to operate and the production efficiency or Unit Per Hour (UPH) is extremely low.

It is within this context that embodiments of the present invention arise.

BRIEF DESCRIPTION OF THE DRAWINGS

As shown in attached drawing, the embodiment of the invention is more sufficiently described. However, the attached drawing is only used for explaining and illustrating rather than limiting the scope of the invention.

FIG. 1B is a flow diagram of a flip chip process of the present invention.

DETAILED DESCRIPTION OF THE PREFERRED EMBODIMENTS

Figure 2A:
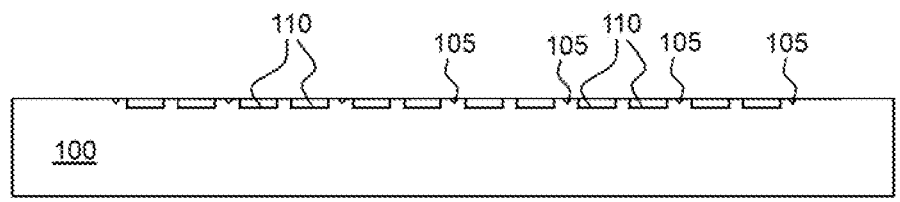
FIGS. 2A-2L are cross-sectional schematic diagrams of a process of making a semiconductor device including forming a support ring at the back surface for a mechanical support for the thinned wafer.
Figure 2B:
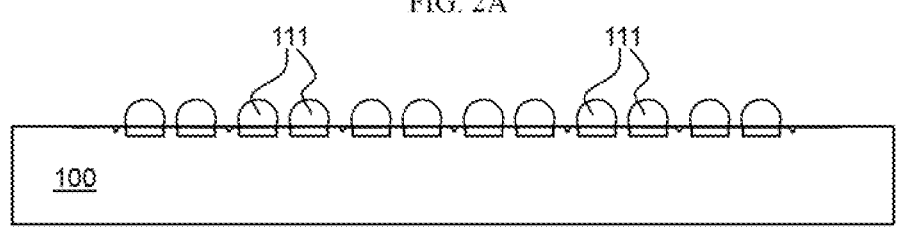

Referring to FIG. 2A, a semiconductor wafer 100 includes, at its front surface, a plurality of semiconductor chips and a plurality of scribe lines 105 each of which locates between two adjacent chips. The scribe line can be used as the reference for cutting to separate individual chips from the wafer, which is well known in the art. A plurality of metal pads 110 are formed at the front surface of the semiconductor chip for connecting to a power supply, to the ground, or to an external circuit. Commonly, an under-bump metal (UBM) layer, such as Ni/Au, (not shown) is firstly plated on metal pads 110. A metal ball or bump 111 is formed on each metal pad 110, for example, a tin soldering ball, or copper bump in spherical, cylindrical or wedge shape, and the like. A first plastic package layer 120 is formed to cover the front surface of the wafer 100. The first plastic package layer 120 may include epoxy plastic material. In a preferred embodiment, the first plastic package layer 120 only covers the center area of the front surface of the wafer 100, and not covers the outermost ring area of the front surface of the wafer 100. As shown in the cross-sectional schematic diagram of FIG. 2C or the top view of FIG. 2M, similar to the wafer, the surface area of the first plastic package layer 120 is also a circle with the radius of the first plastic package layer 120 smaller than that of the wafer, as such a first ring area 103 without being covered by the first plastic package layer 120 is formed at the edge of the front surface of the wafer 100 with both ends of each scribe line 105 exposing in the first ring area 103.

Figure 2C:
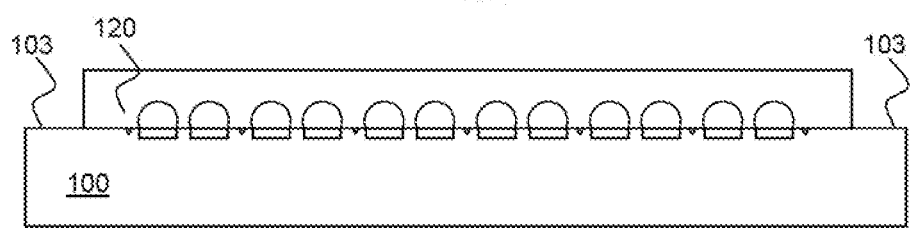
Figure 2D:
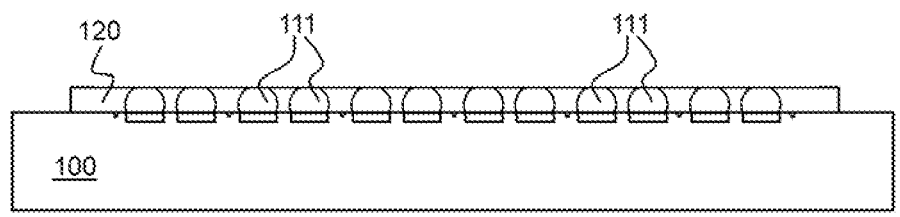
Figure 2E:
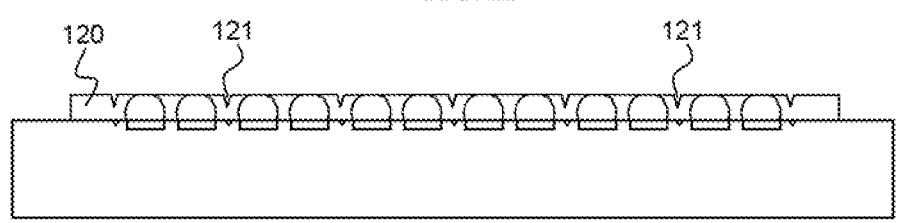
Figure 2F:
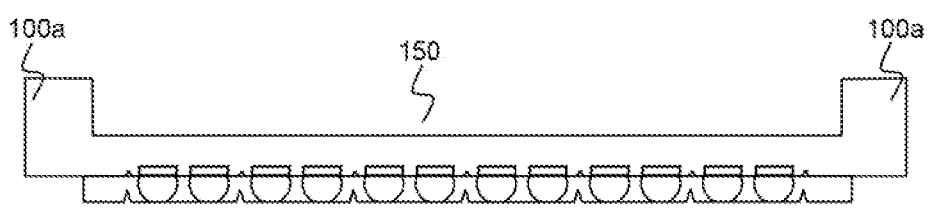

As shown in FIGS. 2C-2D, the metal bumps 111 are completely covered by the first plastic packaging layer 120, thus the first plastic package layer 120 is ground to expose the metal bumps 111 from the first plastic package layer 120. Then, the first plastic package layer 120 is cut along a straight line formed by two ends of each scribe line 105 exposing in the first ring area 103, as shown in FIG. 2E, forming a plurality of shallow grooves as reference lines 121, with each reference line 121 being superimposed with a corresponding scribe line 105. The mechanical strength of the wafer 100 is increased due to the physical support of the first plastic package layer 120, therefore the wafer 100 can be thinned without breaking. In FIG. 2F, the wafer 100 is flipped, then the center area of the back surface of the wafer 100 is ground to thin the wafer by a grinding wheel (not shown) to form a recessed area 150, while the outermost area of the wafer 100 is not ground, thus a support ring 100*a* is formed at of the edge of the back surface of the wafer 100. The radius of the recessed area 150 is preferably smaller than that of the first plastic package layer 120, therefore the support ring 100*a* is partially overlapped with the first plastic package layer 120, as such the mechanical strength of the wafer is improved.

Figure 1A:
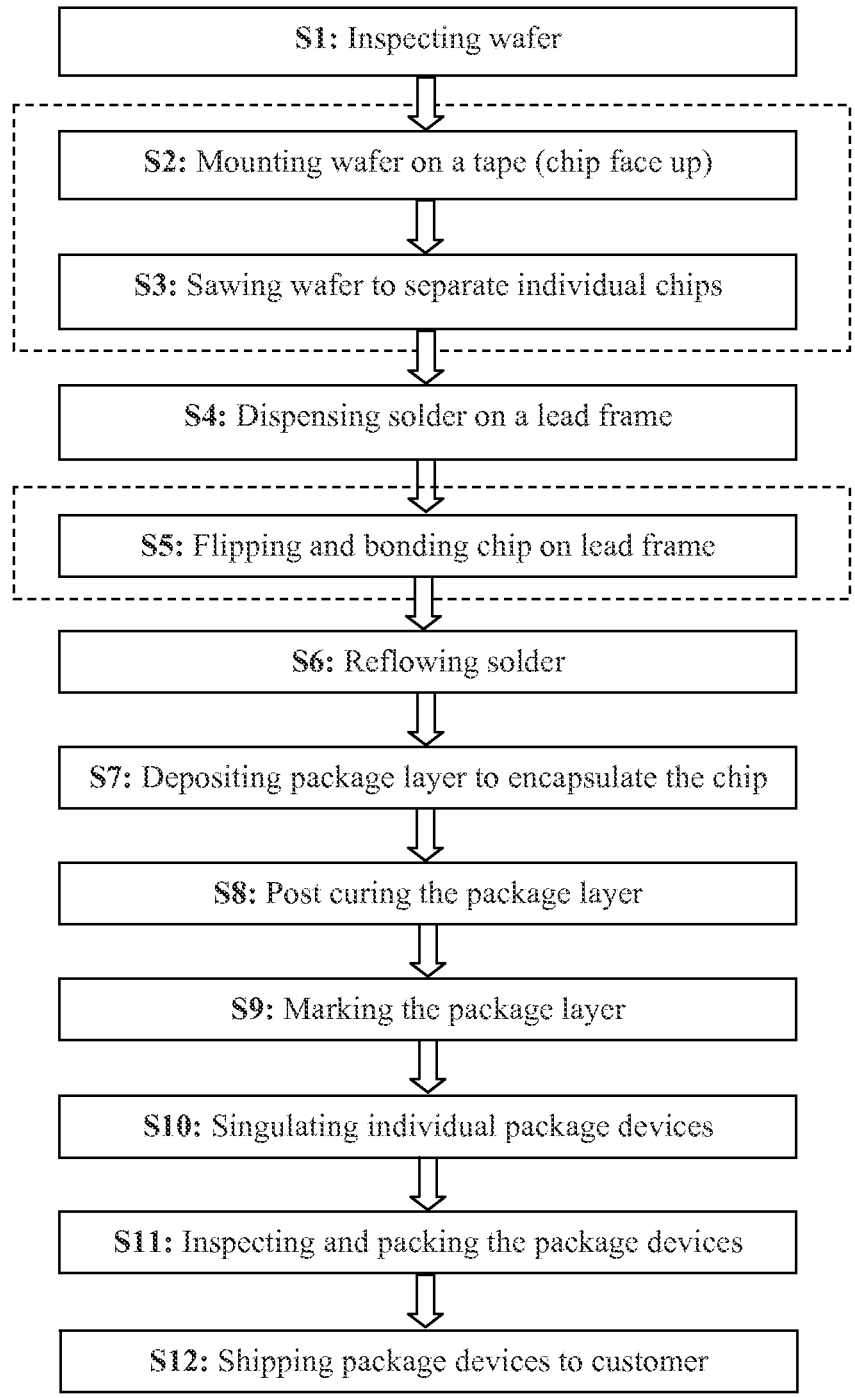
FIG. 1A is a flow diagram of a flip chip process in the prior art.
Figure 2G:
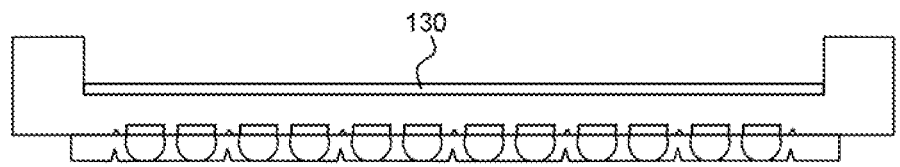
Figure 2H:
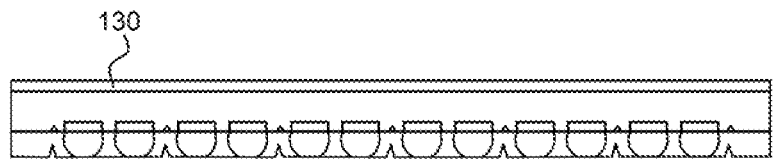
Figure 2I:
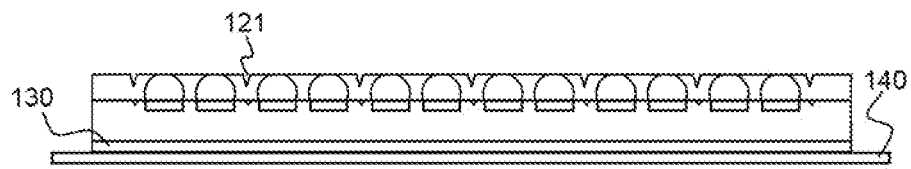
Figure 2J:
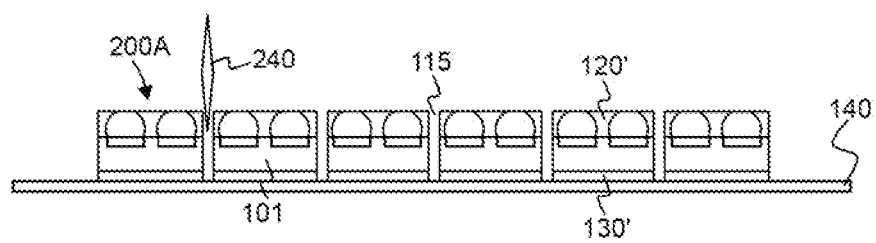
Figure 2K:
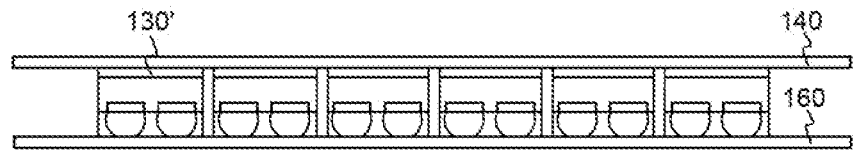
Figure 2L:
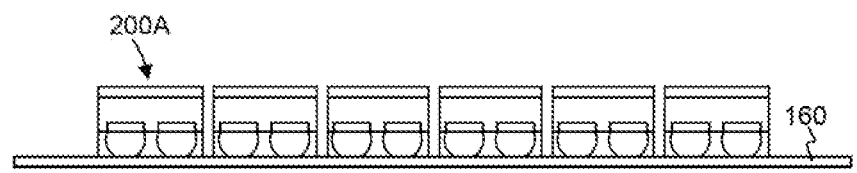
Figure 2M:
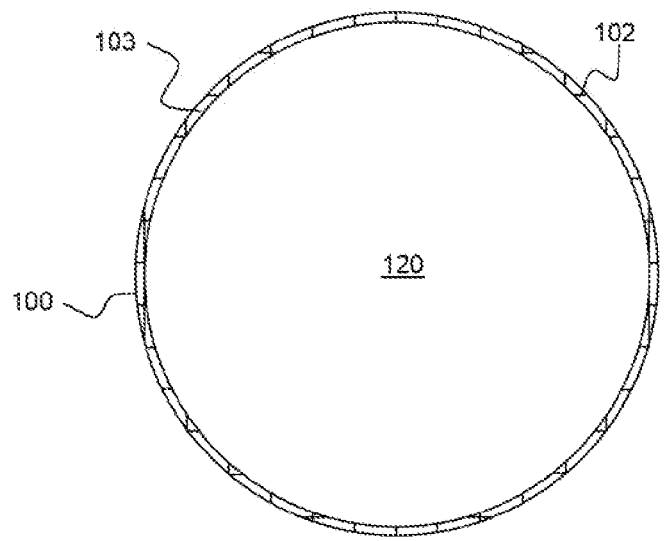
FIG. 2M is a top view of the wafer shown in FIG. 2D including a first ring area at the edge of the front surface of the wafer not being covered by a first plastic package layer.

As shown in FIGS. 2G-2H, a metal layer 130 is deposited at the back surface of the thinned wafer, then, the support ring 100*a* is cut off. In an optional embodiment, after the wafer is thinned, the back surface of the thinned wafer is further etched and then injected with dopant to improve the Ohmic contact. As shown in FIG. 2I, the thinned wafer 100 is flipped back and mounted with the metal layer 130 attached on an adhesive film 140. The first plastic package layer 120, the wafer 100 and the metal layer 130 are thus singulated along the reference line 121, forming kerfs 115, by a cutter blade 240 as shown in FIG. 2J forming a plurality of individual semiconductor devices 200A, each of which includes a semiconductor chip 101 and is still attached on the adhesive film 140. The singulation of the first plastic package layer 120 forms a plurality of top plastic package layers 120' each of which covers a front surface of each chip 101. The singulation of the metal layer 120 forms a plurality of the bottom metal layers 130' each of which located at the back surface of each chip 101. As a result, each device 200A comprises a semiconductor chip 101, a top plastic package layer 120', a bottom metal layer 130' and metal bumps 111 formed on the pads 110 at the front surface of the chip 101, where the top plastic package layer 120' surrounds the metal bumps 111 with the top surface of the metal bumps 111 exposed from the top plastic package layer 120'. Furthermore, as shown in FIG. 2K, the whole structure including the devices 200A attached on the adhesive film 140 is flipped one more time and attached on another adhesive film 160. Both of the adhesive films 140 and 160 can be ultraviolet (UV) films. As shown in FIG. 2L, the adhesive film 140 is removed. At this stage, the metal bumps 111 of the semiconductor device 200A face downward, so that the semiconductor device 200A can be directly picked up by a common equipment from the adhesive film 160 and attached onto a substrate (such as metal substrate or PCB), without a need of an additional special flip-chip equipment to flip each device before attaching it into the substrate as described above in the FIG. 1A of the conventional process.

In a preferred embodiment, the semiconductor chip 101 is a vertical power device with the current flowing from the front to the back or vice versa, for example, a MOSFET and the like, in which the plurality of pads 110 include the source and gate pads and the bottom metal layer 130' include the drain.

Figure 3A:
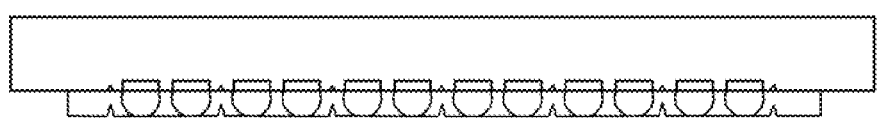
FIGS. 3A-3C are cross-sectional schematic diagrams of some steps of a process of making a semiconductor device without forming a support ring at the back surface of the wafer.
Figure 3B:
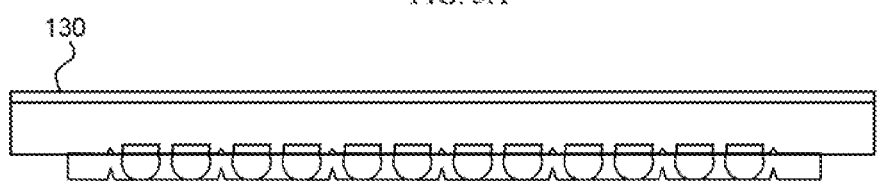
Figure 3C:
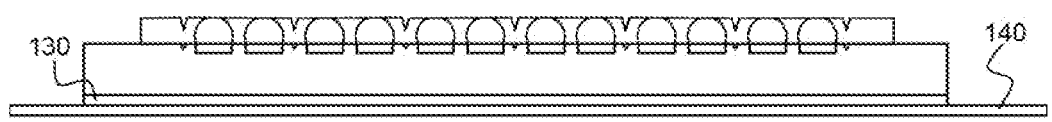

In another embodiment, the wafer 100 is not required to be ultra-thin; therefore the wafer is only ground to a predetermined thickness for reducing the substrate resistance without forming the support ring 100*a*. For example, after completing the steps of FIG. 2E, as shown in FIG. 3A-3C, the wafer is flipped and then is uniformly ground from its whole back surface. A metal layer 130 is deposited on the back surface of the thinned wafer 100. The wafer 100 is then flipped back and the metal layer 130 at the back surface of the thinned wafer 100 is attached on an adhesive film 140. This process is completed with the steps of FIG. 2J-2L.

Figure 4A:
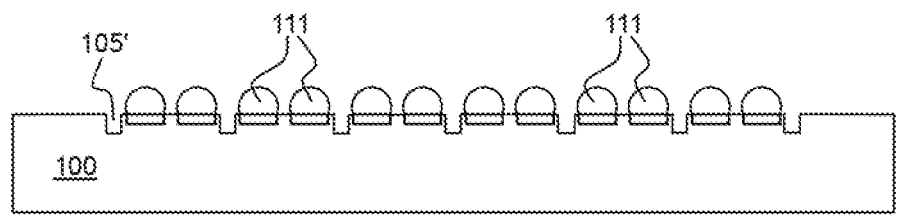
FIGS. 4A-4J are schematic diagrams of a process of making a semiconductor device including forming a recessed ring area at the edge of the back surface of the thinned wafer.
Figure 4B:
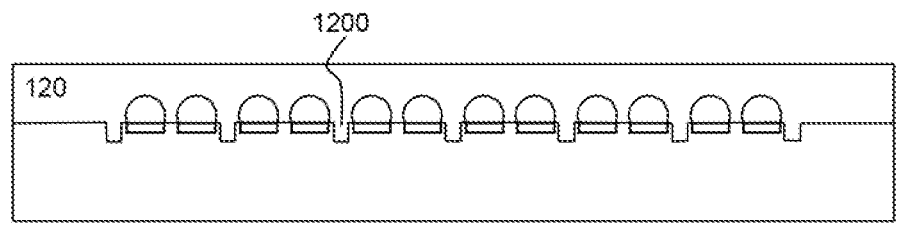
Figure 4C:
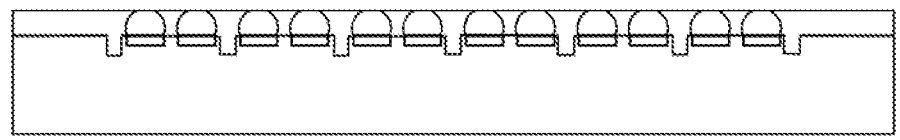
Figure 4D:
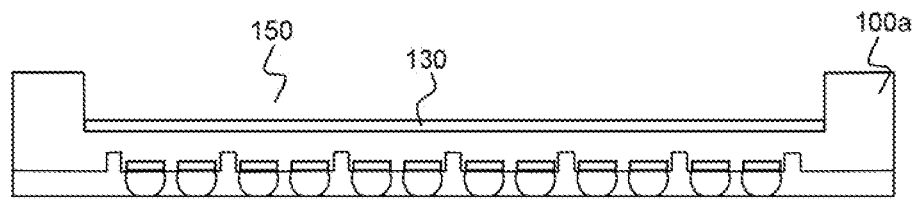

In another embodiment, the first ring area 103 at the front of the wafer 100 is not necessary, for example, as shown in FIG. 4A-4B, after the metal bumps 111 is deposited on each pad 110, the wafer 100 is cut from its front surface along the scribe lines 105 forming deep grooves 105', then, a first plastic package material 1200 is deposited forming the first plastic package layer 120 completely covering the whole front surface of the wafer 100 and also filling in the deep grooves 105'. If the scribe line 105 has a first depth and the deep groove 105' has a second depth, the second depth is larger than the first depth, where the second depth is about ½ to ⅔ of the thickness of the thinned wafer 100 and the first depth is negligible comparing to the second depth or the depth of the thinned wafer. As shown in FIG. 4B, the first plastic package layer 120 completely encapsulates the metal bumps 111. As shown in FIG. 4C, the first plastic package layer 120 is ground to expose the metal bumps 111. The wafer 100 is flipped and then ground from it back surface, as shown in FIG. 4D, similar to the step shown in FIG. 2F with a support ring 100*a* formed at the edge of the back surface of the wafer, and then the metal layer 130 is deposited at the back surface of the thinned wafer 100.

Figure 4E:
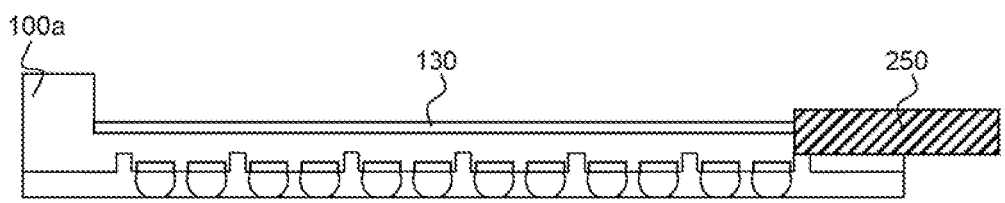
Figure 4F:
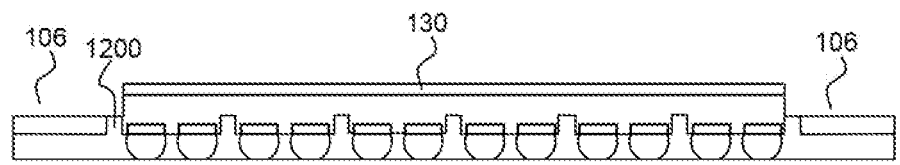
Figure 4G:
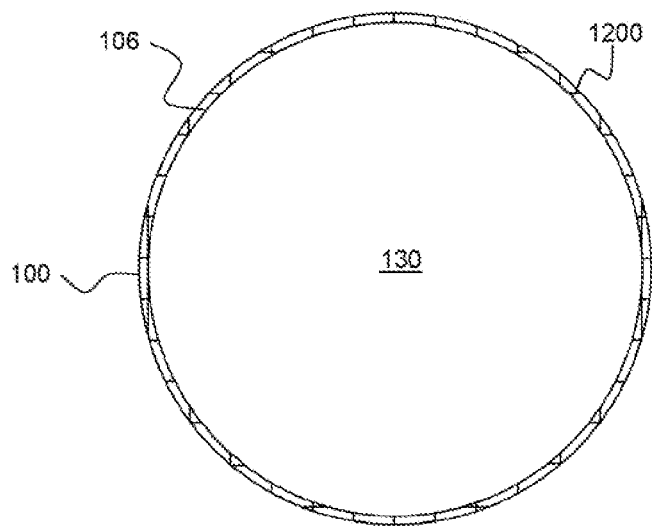
Figure 4H:
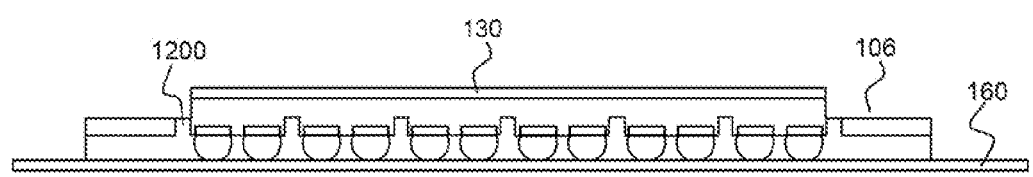
Figure 4I:
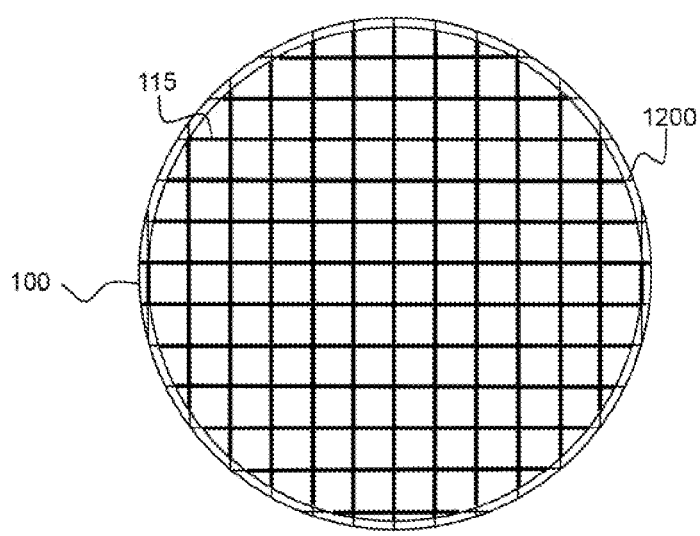
Figure 4J:
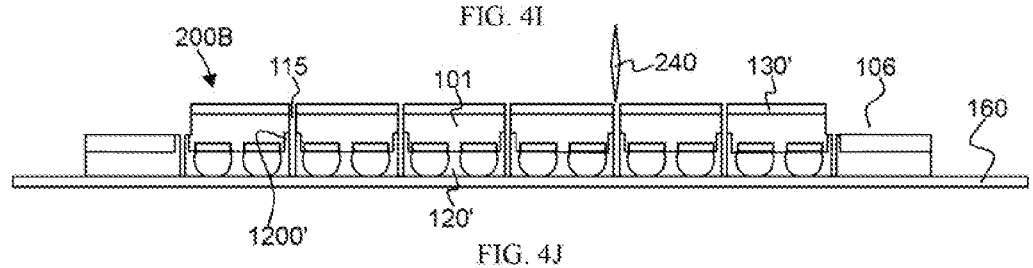
Figure 5A:
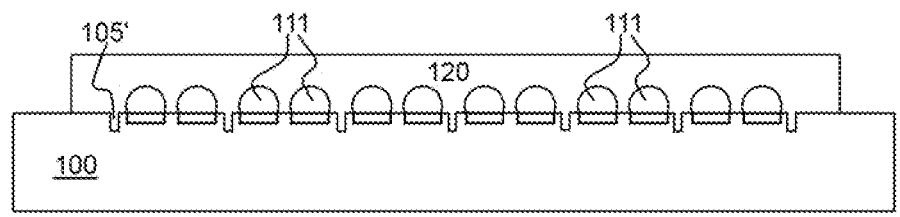
FIGS. 5A-5D are schematic diagrams of some steps in a process of making a semiconductor device including cutting along a scribe line to form a deep groove.
Figure 5B:
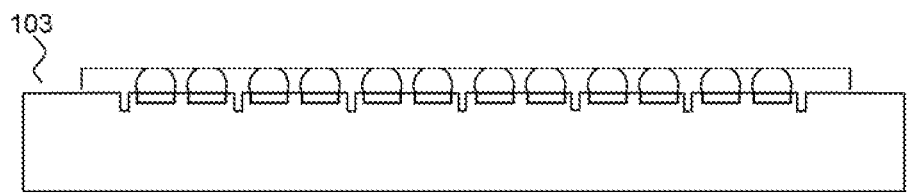
Figure 5C:
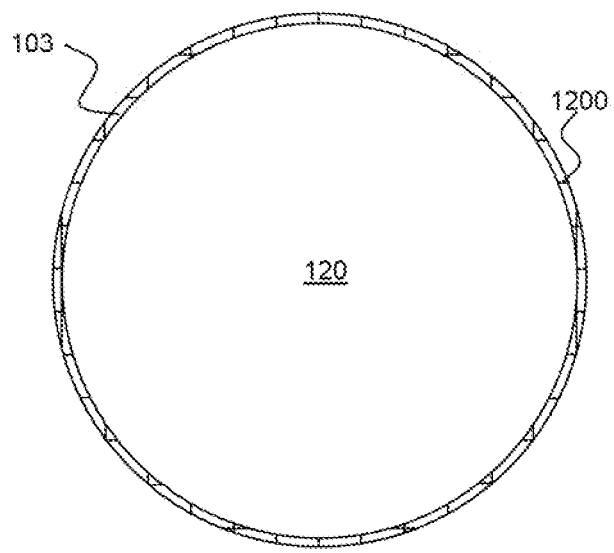
Figure 5D:
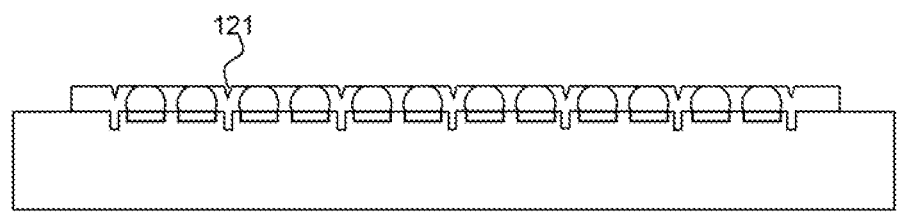

As shown in FIGS. 4E-4F, the outermost portion of the metal layer 130 and the outermost portion at the back surface of the wafer 100 including the support ring 100*a* are ground by a grinding wheel 250 in a circular motion around the center of the wafer 100 forming a recessed ring area 106 around the edge at the back surface of the thinned wafer 100 and recessed from the metal layer 130 with the end portions of the deep grooves 105' filled with the plastic package material 1200 exposed in the recessed ring are 106 as shown in the top view of FIG. 4G. As shown in FIG. 4H, the first plastic package layer 120 is attached on the adhesive film 160. The metal layer 130, the thinned wafer 100, the first plastic package layer 120 and the plastic package material 1200 filled in the deep grooves 105' are singulated along a straight line formed by two end of the deep grooves 105' exposed in the recessed ring area 106 forming kerfs 115, as such a plurality of semiconductor devices 200B are formed as shown in the top view of FIG. 4I and the cross-sectional view of FIG. 4J. In an alternative embodiment, the first plastic package layer 120 is attached to the adhesive film 160 in the step of FIG. 4E before the grinding step to form the recessed ring area 106.

The semiconductor device 200B is only different from the semiconductor device 200A as follows: if a cutter blade 240 is narrower than the deep groove 105', the plastic package material 1200 in the deep groove 105' is not cut off completely, as such a first side plastic package layer 1200' is formed on the side wall at the top portion of the semiconductor chip 101 of the device 200B.

In an embodiment shown in FIGS. 5A-5D, the only difference between the steps of FIGS. 5A-5D and the steps of FIGS. 2A-2E is as follows: in the steps of FIGS. 5A-5D, after the metal bumps 111 is deposited on each pad 110, the wafer 100 is cut from its front surface along the scribe line 105 to form deep grooves 105' with a second depth and filled with the plastic package material 1200 similar to FIG. 4A as described above. As such, after the first plastic package layer 120 is formed and ground, it is then cut along a straight line formed by both ends of the deep groove 105' exposed in the first ring area 103 forming a plurality of reference lines 121 (similar as that of FIG. 2E), thus the remaining steps are the similar as that of FIGS. 2F-2L.

Figure 6A:
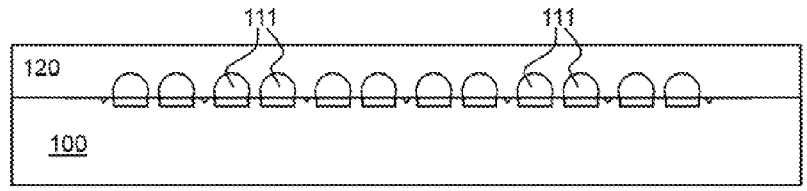
FIGS. 6A-6F are cross-sectional schematic diagrams of a process of making a semiconductor device including grinding the outermost portion of a metal layer to form a second ring area.
Figure 6B:
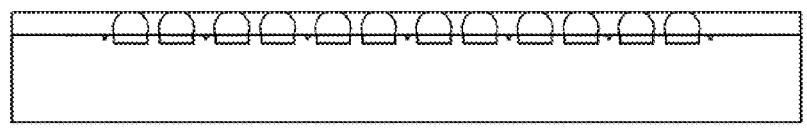
Figure 6C:
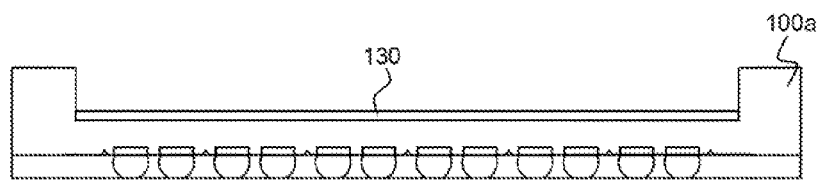
Figure 6D:
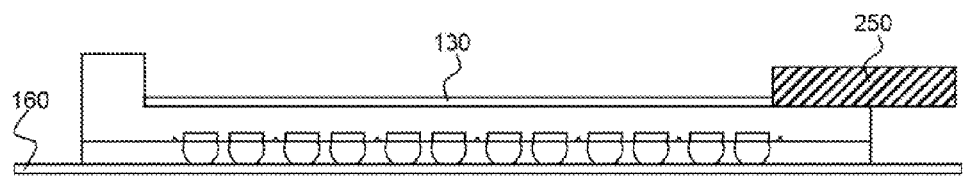
Figure 6E:
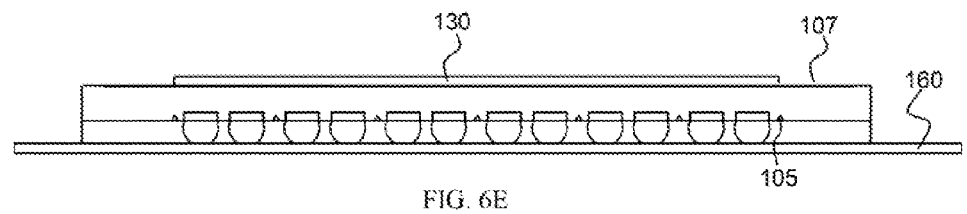
Figure 6F:
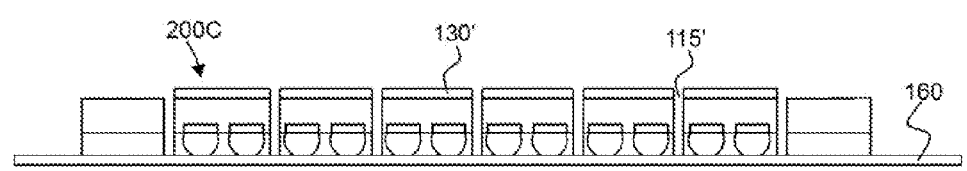

In another embodiment, for example, as shown in FIGS. 6A-6C, after the metal bumps 111 is deposited on each pad 110, the first plastic package layer 120 is formed to completely cover the whole front surface of the wafer 100. After the first plastic package layer 120 is ground to expose the metal bumps 111, the wafer 100 is flipped and the center area of the back surface of the wafer 100 is ground to thin the wafer, which forms a support ring 100a with the original thickness at the edge of back surface of the wafer 100. A metal layer 130 is then deposited at the back surface of the thinned wafer 100, then the whole wafer is attached on an adhesive film 160 with the first plastic package layer 120 directly attached on the adhesive film 160. The outermost portion of the metal layer 130 and the support ring 100a at the back surface of the wafer 100 are ground by a grinding wheel 250 in a circular motion around the center of the wafer 100 as shown in FIG. 6D, thus the radius of the metal layer 130 is reduced and a second ring area 107 not covered by the metal layer 130 is formed at the edge of the back surface of the thinned wafer 100. Two ends of each scribe line 105 located in the second ring area 107 is detected through the thinned wafer 100 by an infrared ray. As such, the metal layer 130, the wafer 100 and the first plastic package layer 120 are cut through a straight line formed by the two detected ends of the scribe line 105 forming a plurality of semiconductor devices 200C that is similar to the semiconductor devices 200A in FIG. 2L.

Figure 7A:
FIGS. 7A-7E are cross-sectional schematic diagrams of a process of making a semiconductor device with the metal bumps not completely encapsulated by the plastic package layer.
Figure 7B:
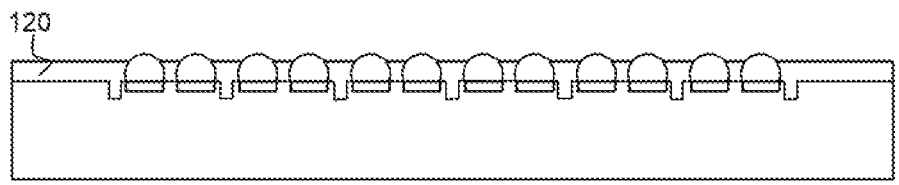
Figure 7C:
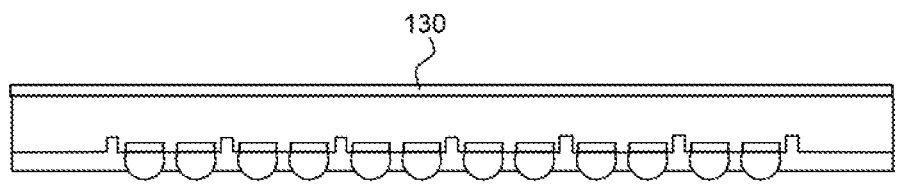
Figure 7D:
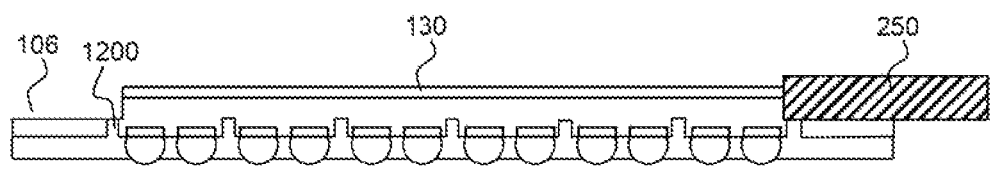
Figure 7E:
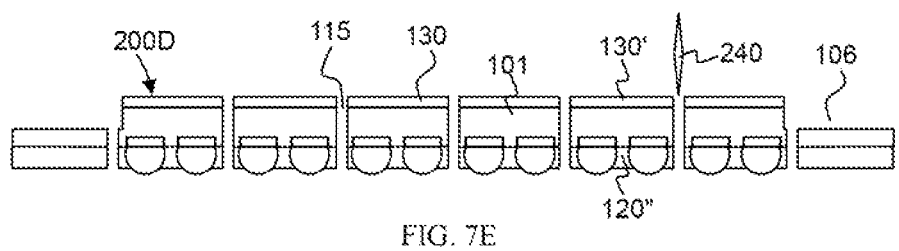

In another embodiment, as shown in FIG. 7A-7B, the first plastic package layer 120 is deposited to cover the whole front surface of the wafer 100 after the deep grooves 105' is formed, but the first plastic package layer 120 is not completely encapsulated the metal bumps 111, for example, the thickness of the first plastic package layer 120 is smaller than the height of the metal bumps 111, as such the metal bumps 111 is exposed from the first plastic package layer 120. The wafer 100 is then flipped, as shown in FIG. 7C, and the wafer 100 is ground to thin form its back surface followed by the deposition of a metal layer 130 at the back surface of the thinned wafer 100. As shown in FIG. 7D, the outermost portion of the metal layer 130 and that at the back surface of the wafer 100 are ground by the grinding wheel 250 around the edge at the back surface of the wafer 100 forming a recessed ring area 106 recessed from the metal layer 130 such that both ends of the deep groove 105' filled with the plastic package material 1200 exposed at the ring area 106 (FIG. 7D). The first plastic package layer 120 is attached on an adhesive film (not shown) similarly as described above, then the metal layer 130, the wafer 100, the first plastic package layer 120 and the plastic package material 1200 filled into the deep groove 105' is cut along the straight line formed by both ends of the deep groove 105' exposed in the ring area 106 forming a plurality of semiconductor devices 200D as shown in FIG. 7E, which similar to the semiconductor devices 200A as shown in FIG. 2L excepting that the metal bumps 111 of the device 200D are exposed from the top plastic package body 120' formed by cutting from the first plastic package layer 200. Furthermore, different from the semiconductor devices 200B in FIG. 4J, the sidewall of the top portion of the chip 101 in the semiconductor devices 200D is not covered with the plastic package material. In particular, if the cutter blade 240 is wider than the deep groove 105', the structure similar to the semiconductor devices 200D is formed. Otherwise, if the cutter blade 240 is narrower than the deep groove 105', the structure similar to the semiconductor devices 200B is formed.

Figure 8A:
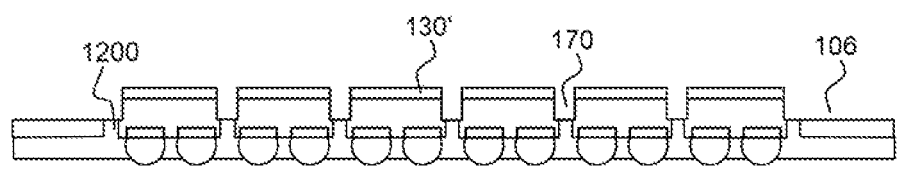
FIGS. 8A-8C are cross-sectional schematic diagrams of some steps of a process of making a semiconductor device including forming another plastic package layer at the back surface of the wafer.
Figure 8B:
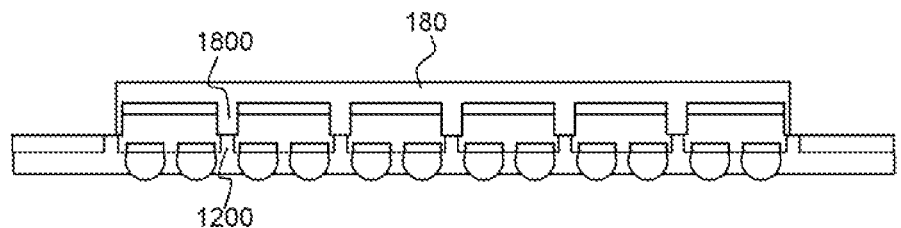

In another embodiment, after FIG. 7A-7D are completed, as shown in FIG. 8A, the metal layer 130 and a bottom portion of the wafer 100 are cut from the back surface of the wafer 100 along the straight line formed by both ends of the deep groove 105' filled with the plastic package material 1200 in the ring area 106 forming a plurality of cutting grooves 170, where each cutting groove 170 are superimposed with each deep groove 105', thus the metal layer 130 is cut to form a plurality of bottom metal layers 130'. In an embodiment, the bottom of cutting groove 170 is in contact with the bottom of the deep groove 105'. As shown in FIG. 8B, a second plastic package material 1800 is deposited to fill the cutting grooves 107 and to form a second plastic package layer 180 covering the bottom metal layers 130'. Then, the first plastic package layer 120, the second plastic package layer 180, the plastic package material 1200 filled into the deep groove 105' and the plastic package material 1800 filled into the cutting groove 170 are cut along the straight line formed by both ends of the deep groove 105' filled with the plastic package material 1200 exposed in the ring area 106 to form a plurality of semiconductor devices 200E, where the second plastic package layer 180 is cut to form a plurality of the bottom plastic package layers 180' covering the bottom metal layers 130; the first plastic package layer 120 is cut to form a plurality of the top plastic package layer 120" covering the front of semiconductor chips 101 with the metal bumps 111 exposed from the top plastic package layer 120".

Figure 8C:
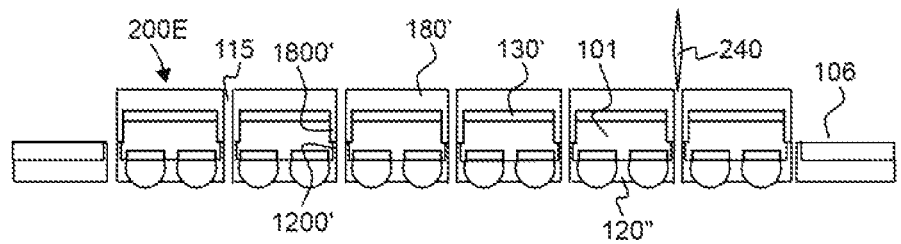
Figure 9A:
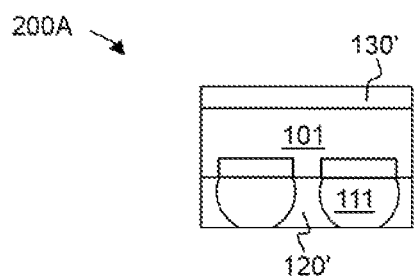
FIGS. 9A-9D are cross-sectional schematic diagrams of different semiconductor devices formed with different processes of the present invention.
Figure 9B:
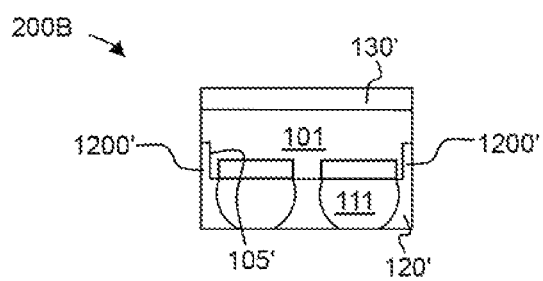
Figure 9C:
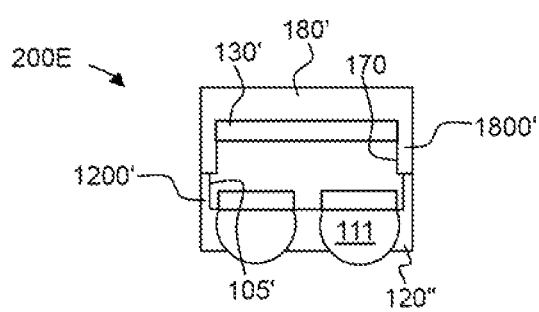
Figure 9D:
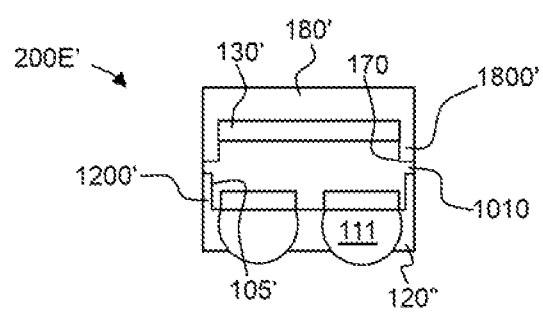

The width of the kerfs 115 is varied depending on the width of the cutter blade 240, thus the semiconductor device with or without plastic package layer covering the side wall of the semiconductor chip 101 is formed. For example, the side wall of the chip 101 in FIG. 7E is not covered with any plastic package layer formed by completely cutting the plastic package material 1200 filled in the deep groove 105'. In FIG. 8C, the cutter blade 240 is narrower than the deep groove 105' and the cutting groove 170, so that the plastic package material 1200 filled into the deep groove 105' is cut to form the first side plastic package layer 1200', and the plastic package material 1800 filled into the cutting groove 107 is cut to form the second side plastic package layer 1800'. The first side plastic package layer 1200' covers on the side wall of the top portion of the chip 101 and the second side plastic package layer 1800' covers on the side wall of the bottom portion of the chip 101. In the semiconductor device 200E, the semiconductor chip 101 is completely encapsulated by the first side plastic package layer 1200', the top plastic package layer 120', the second side plastic package layer 1800' and the bottom plastic package layer 180'. In an alternative embodiment, in the semiconductor device 200E' as shown in FIG. 9D, the bottom of the cutting groove 170 is not in contact with the bottom of the deep groove 105', therefore the first side plastic package layer 1200' covers on the side wall of the top portion chip 101 and the second side plastic package layer 1800' covers on the side wall of the bottom portion of the chip 101, but the side wall of the middle portion 1010 of the chip 101 is not covered with any plastic package layer. The structures of the semiconductor devices 200A, 200B, 200E and 200E' are shown in FIG. 9A to FIG. 9D.

Furthermore, compared to the convention method as shown flow diagram of FIG. 1A, in the current method as shown in the flow diagram shown in FIG. 1B, the steps S1, S4 and S6-S12 of the current method are same with steps S6-S12 of the prior art method, but the steps S2, S3 and S5 of FIG. 1A of the prior art method are replace with steps S2', S3' and S5' of FIG. 1B of the current method. In step S2' the wafer is flipped and then attached on an adhesive film with the back surface of the wafer facing upward or the chip facing downward. In step S3, the wafer is cut from its backside to separate individual chips from the wafer along a straight line formed by two ends of a scribe line that can be exposed in a grounded ring area, for example ring area 103 or ring area 106, or can be detected by an infrared ray through a ground ring area, for example ring area 107, as described above. As such, the semiconductor devices 200A-200E formed by the current method include a semiconductor chip with the metal bumps 111 formed at it front surface facing downward. As a result, a regular die pick up equipment (not a flip chip die pick up equipment) can be used to pick up the semiconductor devices 200A-200E from the adhesive film 160 and attach the devices on a substrate without flipping the devices. If the metal bumps 111 are made of a tin soldering material, it can be directly attached on a metal pad on the substrate. If the metal bumps 111 are not made of an adhesive material, an additional bonding material is needed for the electrical and mechanical connection between the metal bumps and the substrate.

The above detailed descriptions are provided to illustrate specific embodiments of the present invention and are not intended to be limiting. Numerous modifications and variations within the scope of the present invention are possible. The present invention is defined by the appended claims.

The invention claimed is:

1. A method for preparing semiconductor devices applied in a flip chip packaging process comprising:
depositing a first plastic chip package layer at a front surface of a semiconductor wafer including a plurality of semiconductor chips on the front surface, wherein a radius of the first plastic chip package layer is smaller than that of the semiconductor wafer thus forming a first ring area not covered by the first plastic chip package layer at an edge of the front surface of the semiconductor wafer;
cutting the first plastic chip package layer to a first depth shallower than a thickness of the first plastic chip package layer along each scribe line on the front surface of the semiconductor wafer using two ends of each scribe line exposed in the first ring area as reference to form a plurality of reference lines;
flipping the semiconductor wafer and grinding the semiconductor wafer from a back surface opposite to the front surface;
depositing a metal layer at the back surface of the semiconductor wafer after grinding;
mounting the wafer with the metal layer formed at the back surface of the thinned wafer attaching on a first adhesive film;
cutting the first plastic chip package layer, the semiconductor wafer and the metal layer along the reference lines to form a plurality of semiconductor devices, wherein each semiconductor device comprises a semiconductor chip with a top plastic chip package layer formed by cutting the first plastic chip package layer at its front surface and a bottom metal layer formed by cutting the metal layer at its back surface;
flipping the semiconductor devices attached on the first adhesive film and attaching the top plastic chip package layer on a second adhesive film;
removing the first adhesive film attached on the bottom metal layer; and
picking up the semiconductor device and attaching the semiconductor device on a substrate without flipping the semiconductor device.

2. The method of claim 1, wherein a plurality of pads are formed at the front surface of the semiconductor chip and wherein metal bumps are deposited on the pads before depositing the first plastic chip package layer at the front surface of the semiconductor wafer.

3. The method of claim 2, wherein depositing the first plastic chip package layer at the front surface of a semiconductor wafer comprises:
depositing the first plastic chip package layer completely covering the metal bumps; and
grinding the first plastic chip package layer until the metal bumps are exposed from the first plastic chip package layer.

4. The method of claim 2, wherein the thickness of the first plastic chip package layer is smaller than the height of the metal bumps, as such the metal bumps are exposed from the first plastic chip package layer.

5. The method of claim 1, before depositing the first plastic chip package layer at the front surface of the semiconductor wafer, further comprising:
cutting along the scribe lines to form deep grooves;
depositing a first plastic package material to fill the deep grooves and forming the first plastic chip package layer at the front surface of the semiconductor wafer;
cutting the first plastic chip package layer along a straight line formed by two ends of each of the deep grooves filled with the plastic package material and exposed in the first ring area forming a plurality of reference lines.

6. The method of claim 1, wherein in the step of grinding the back of the wafer, only the center area of the back surface of the semiconductor wafer is ground, wherein an outermost area of the semiconductor wafer is not ground forming a support ring at the edge of the back surface of the wafer, and wherein the support ring is cut off after the metal layer is deposited at the back surface of the thinned wafer.

7. A method for preparing semiconductor devices applied in a flip chip packaging process comprising:
cutting along a plurality of scribe lines at a front surface of a semiconductor wafer including a plurality of semiconductor chips on the front surface to form a plurality of deep grooves surrounding each of the semiconductor chips;
depositing a first plastic package material to form a first plastic chip package layer covering the front surface of the semiconductor wafer and filling the deep grooves;

flipping the semiconductor wafer and grinding from a back surface opposite to the front surface of the semiconductor wafer to a thickness larger than a depth of the deep grooves;

depositing a metal layer at the back surface of the semiconductor wafer after grinding;

grinding an outermost portion of the metal layer and the semiconductor wafer around an edge of the semiconductor wafer at the back surface until two ends of each of the deep grooves filled with the plastic package material are exposed from the back surface forming a recessed ring area located at the back surface around the edge of the semiconductor wafer and recessed from the metal layer;

mounting the semiconductor wafer by attaching the first plastic chip package layer on an adhesive film;

cutting the first plastic chip package layer, the semiconductor wafer, the metal layer and the first plastic package material filled in the deep grooves along a straight line formed by two ends of each of the deep groove filled with the first plastic package material exposed in the recessed ring area thus forming a plurality of semiconductor devices; and picking up the semiconductor devices and mounting on a substrate without flipping the semiconductor devices.

8. The method of claim 7, wherein in the step of grinding the back surface of the semiconductor wafer, only a center area at the back surface of the semiconductor wafer is ground, wherein the outermost portion at the edge of the semiconductor wafer is not ground forming a support ring for the semiconductor wafer, and in the step of forming the recessed ring area, the outermost portion of the metal layer and the outermost portion of the semiconductor wafer including the support ring are ground.

9. The method of claim 7, in the step of cutting the first plastic chip package layer, the semiconductor wafer, the metal layer and the plastic package material filled in the deep grooves, a width of a cutting blade is either larger than or the same as that of the deep grooves, as such the plastic package material filled in the deep grooves is completely removed and the side wall of the semiconductor chip in the semiconductor device is exposed.

10. The method of claim 7, in the step of cutting the first plastic chip package layer, the semiconductor wafer, the metal layer and the plastic package material filled in the deep grooves, a width of a cutting blade is narrower than a width of the deep groove, as such the plastic package material filled in the deep groove is not completely removed forming a first side plastic chip package layer covering on the side wall of the top portion of the semiconductor chip in the semiconductor device.

11. A method for preparing semiconductor devices applied in a flip chip packaging process comprising:

cutting along a plurality of scribe lines at a front surface of a semiconductor wafer including a plurality of semiconductor chips formed at the front surface thus forming a plurality of deep grooves;

depositing a first plastic package material to form a first plastic chip package layer covering the front surface of the wafer and filling in the deep grooves;

flipping the semiconductor wafer and grinding a back surface of the semiconductor wafer opposite to the front face to thin the semiconductor wafer to a thickness larger than a depth of the deep grooves;

depositing a metal layer at the back surface of the thinned wafer;

grinding an outermost portion of the metal layer and an outermost portion of the semiconductor wafer around an edge at the back surface of the semiconductor wafer until two ends of each of the deep grooves filled with the plastic package material is exposed from the back surface forming a recessed ring area located at the back surface around the edge of the semiconductor wafer and recessed from the metal layer;

mounting the wafer by attaching the first plastic chip package layer on an adhesive film;

cutting the metal layer and the semiconductor wafer along a straight line formed by the two ends of each of the deep grooves filled with plastic package material exposed in the recessed ring area at the back surface of the semiconductor wafer thus forming a plurality of cutting grooves reaching a second depth, each of the cutting grooves superimposed with a deep groove;

depositing a second plastic package material to form a second plastic chip package layer covering the bottom metal layer and to fill in the cutting grooves;

cutting the first plastic chip package layer, the second plastic chip package layer, the first plastic package material filled in the deep grooves and the second plastic package material filled in the cutting groove along the straight line formed by two ends of each of the deep grooves filled with the first plastic package material exposed in the recessed ring area thus forming a plurality of semiconductor devices, each of which includes a semiconductor chip; and picking up the semiconductor device and mounting on a substrate without flipping the semiconductor device.

12. The method of claim 11, wherein in the step of grinding from the back surface of the semiconductor wafer, only a center area of the back surface of the semiconductor wafer is ground, wherein the outermost portion of the wafer is not ground thus forming a support ring at the edge of the semiconductor wafer; and in the step of forming the recessed ring area, the outermost portion of the metal layer and the outermost portion of the semiconductor wafer including the support ring are ground.

13. The method of claim 11, wherein the second plastic chip package layer is cut to form a plurality of bottom plastic chip package layers, each of which covers a bottom metal layer portion; wherein the first plastic package material filled in the deep grooves and the second plastic package material filled in the cutting groove are cut through forming a first side plastic chip package layer and a second side plastic chip package layer adjacent to each other, wherein the first side plastic chip package layer covers on a top side wall portion of the semiconductor chip and the second side plastic chip package layer covers on a bottom side wall portion of the semiconductor chip of the semiconductor device.

14. The method of claim 13, wherein a middle portion of the side wall of the semiconductor chip is exposed.

15. A method for preparing semiconductor devices applied in a flip chip packaging process comprising:

depositing a first plastic chip package layer at a front surface of a semiconductor wafer including a plurality of semiconductor chips formed at the front surface;

flipping the semiconductor wafer and grinding from a back surface opposite to the front surface to thin the semiconductor wafer;

depositing a metal layer at the back surface of the thinned wafer;

removing an outermost portion of the metal layer around an edge of the semiconductor wafer to form a ring area not covered by the metal layer at the edge of the back surface of the thinned semiconductor wafer;

mounting the wafer by attaching the first plastic chip package layer on an adhesive film;

detecting two ends of each scribe line located in the ring area by an infrared ray through the thinned wafer, and cutting the metal layer, the semiconductor wafer and the first plastic chip package layer along a straight line formed by the two detected ends of a scribe line to form a plurality of semiconductor devices; and picking up the semiconductor devices and mounting on a substrate without flipping the semiconductor device.

16. The method of claim 15, wherein in the step of grinding from the back surface of the semiconductor wafer, only a center area at the back surface of the wafer is ground, wherein the outermost portion of the semiconductor wafer is not ground thus forming a support ring at the edge of the semiconductor wafer; and wherein the supporting ring is ground in the step of grinding the metal layer.

\* \* \* \* \*